(12) United States Patent
Mayer

(10) Patent No.: US 6,695,629 B1
(45) Date of Patent: Feb. 24, 2004

(54) LOW-PROFILE MOUNTING AND CONNECTING SCHEME FOR CIRCUIT BOARDS

(75) Inventor: David W. Mayer, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/280,738

(22) Filed: Oct. 25, 2002

(51) Int. Cl.⁷ .................................................. H01K 4/66
(52) U.S. Cl. ........................ 439/92; 361/752; 361/801
(58) Field of Search ..................... 439/92, 95; 361/752, 361/801; 24/41.17; 174/138 G

(56) References Cited

U.S. PATENT DOCUMENTS

| | | |
|---|---|---|
| 4,855,873 A | 8/1989 | Bhargava |
| 5,108,312 A | 4/1992 | Sampson |
| 5,138,529 A | 8/1992 | Colton et al. |
| 5,218,760 A * | 6/1993 | Colton et al. ................. 439/92 |
| 5,281,149 A | 1/1994 | Petri |
| 5,707,244 A | 1/1998 | Austin |
| 5,833,480 A | 11/1998 | Austin |
| 5,973,926 A | 10/1999 | Sacherman et al. |
| 6,017,226 A * | 1/2000 | Jeffries et al. ................. 439/92 |
| 6,019,614 A * | 2/2000 | Baur et al. ..................... 439/92 |
| 6,038,140 A | 3/2000 | Petri |
| 6,065,980 A * | 5/2000 | Leung et al. .................. 439/92 |
| 6,071,131 A | 6/2000 | Pliml, Jr. |
| 6,259,032 B1 | 7/2001 | Fernandez |
| 6,424,537 B1 | 7/2002 | Paquin |
| 6,424,538 B1 | 7/2002 | Paquin |
| 6,456,504 B1 * | 9/2002 | LoForte et al. ............... 439/92 |

* cited by examiner

*Primary Examiner*—Gary Paumen
(74) *Attorney, Agent, or Firm*—Kevin M. Hart

(57) ABSTRACT

A low-profile circuit board mounting and connecting scheme employs a conductive standoff having a shoulder, a stem and a head. A circuit board to be mounted on the standoff defines a clearance hole opening into a channel. The clearance hole is sufficiently large to clear the head of the standoff, and the channel is sufficiently wide to clear the stem but not the shoulder. A conductive clip has two resilient prongs. The clip is mounted to the circuit board so that the prongs are disposed along either side of a portion of the channel. The prongs are able to move toward and away from each other in a plane that is parallel to the plane of the circuit board. The prongs engage the head to make an electrical connection when the stem is moved to the end of the channel.

14 Claims, 7 Drawing Sheets

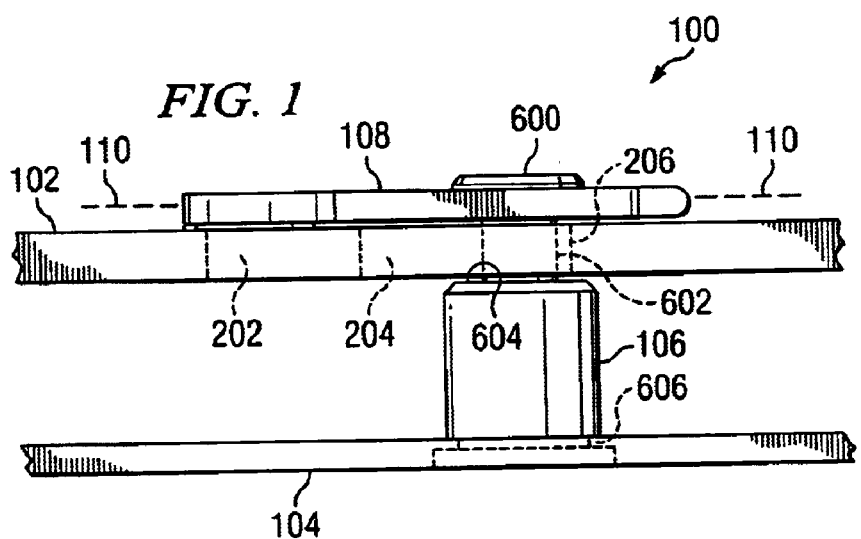
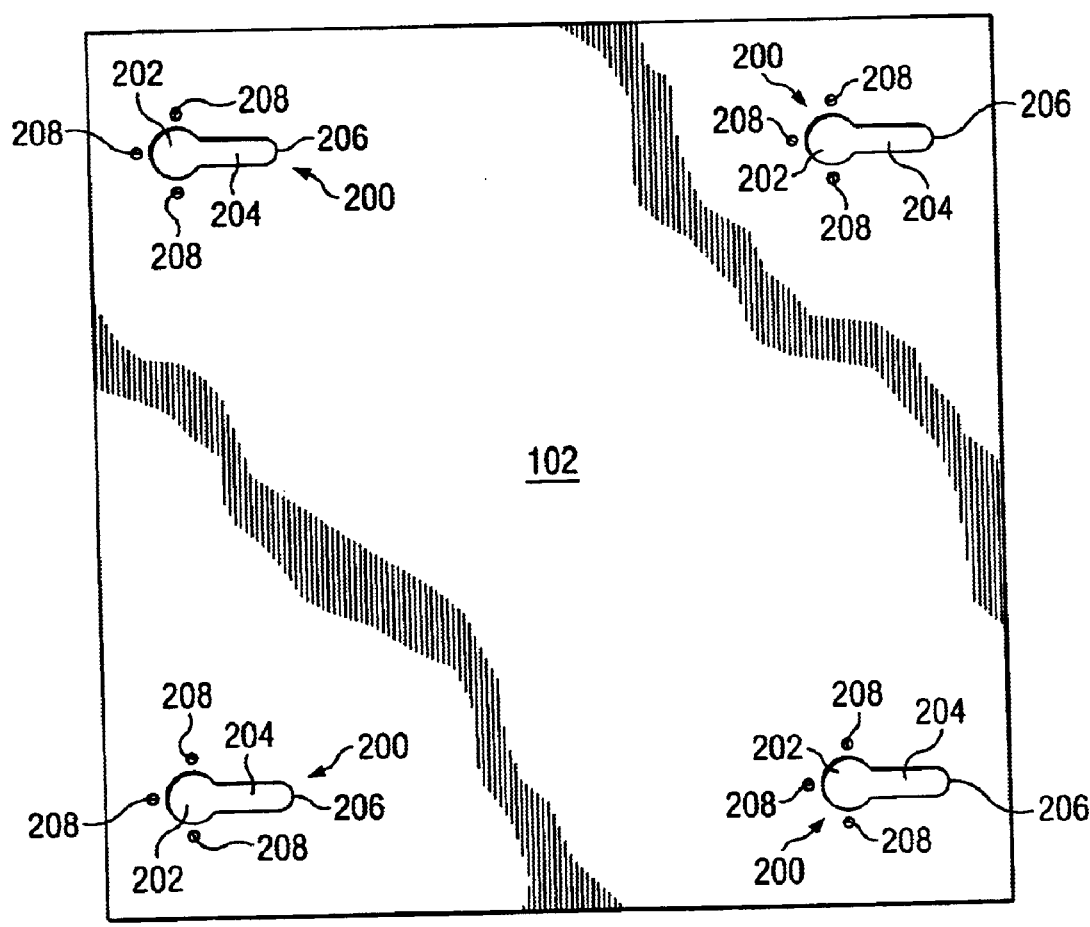

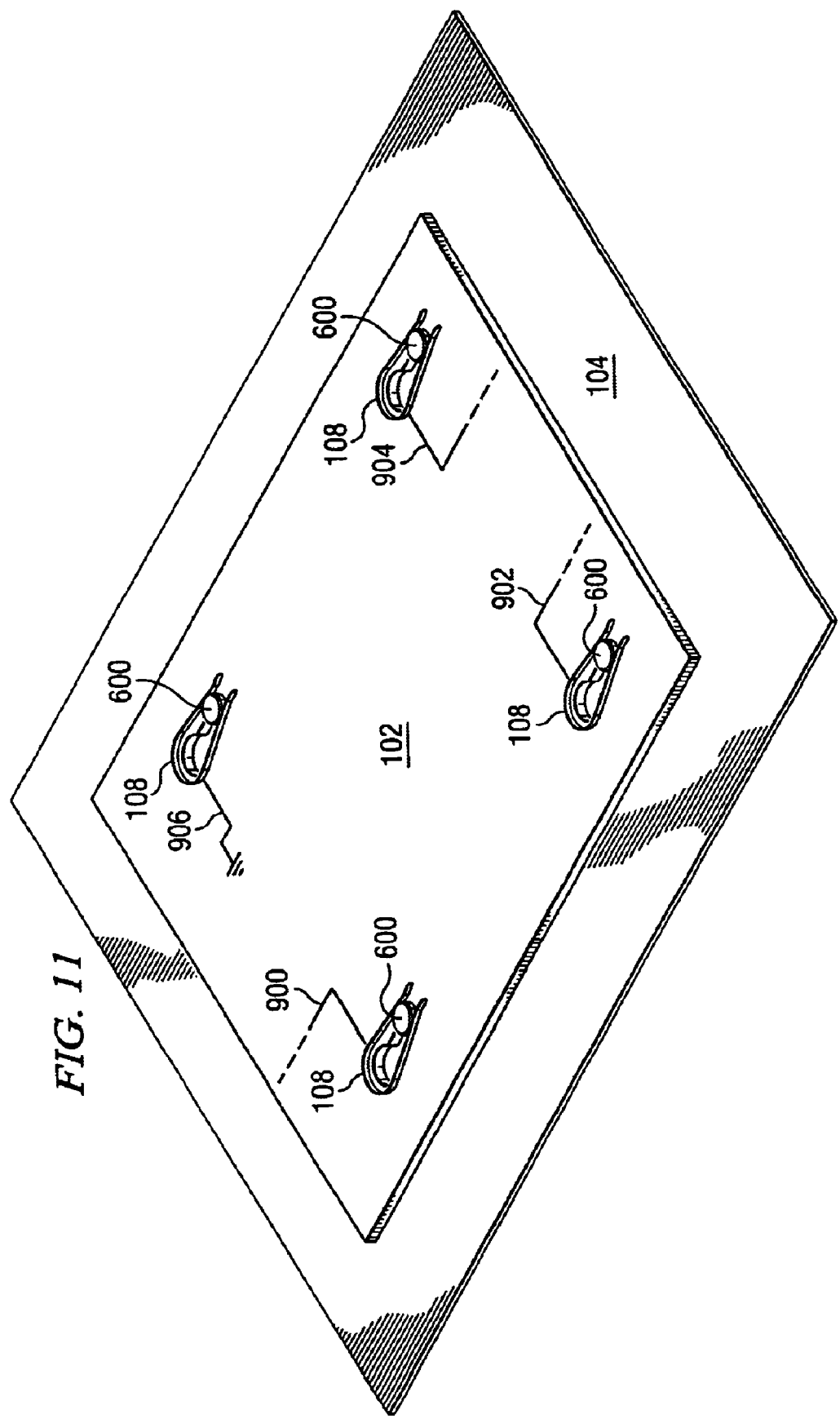

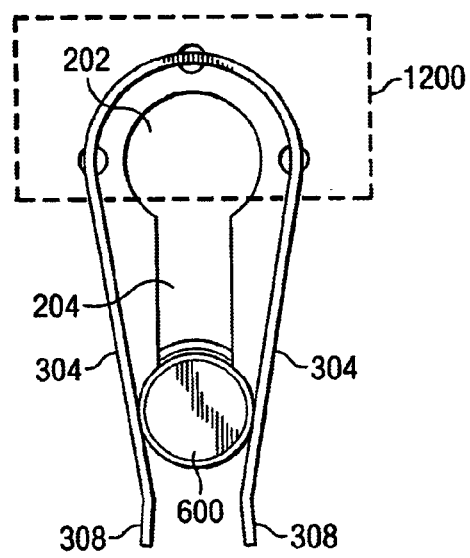
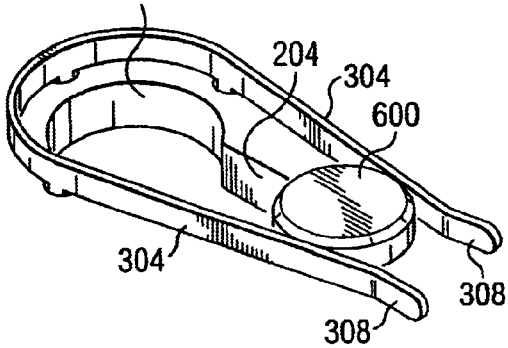
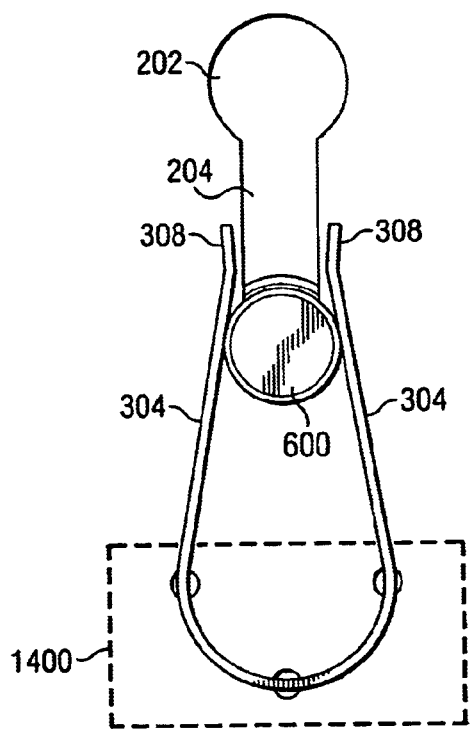
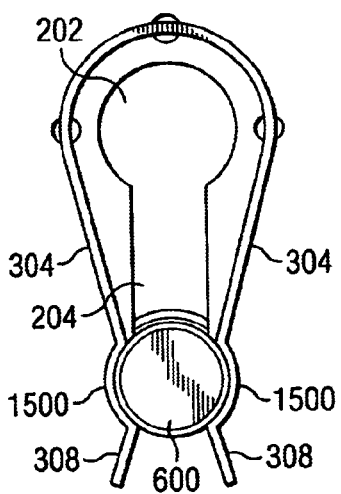

LOW-PROFILE MOUNTING AND CONNECTING SCHEME FOR CIRCUIT BOARDS

FIELD OF THE INVENTION

This invention relates to techniques for mounting a circuit board to a chassis, a frame, another circuit board or the like and for making an electrical connection between the circuit board and the object to which it is mounted.

BACKGROUND

It is typically necessary to mount circuit boards either to a chassis or a frame or to other circuit boards. It also is frequently necessary to provide an electrical connection between the mounted circuit board and the object to which it is mounted—to provide a ground, for example. Numerous techniques have been employed to accomplish mounting and electrical connection simultaneously by using conductive standoffs. Unfortunately, prior art techniques employing conductive standoffs have used elaborately-designed standoffs and have presented rather tall profiles relative to the mounted circuit board. Consequently, such techniques have been expensive and have interfered with product compactness.

SUMMARY OF THE INVENTION

A circuit board mounting and connecting scheme according to a preferred embodiment of the invention employs a conductive standoff having a shoulder, a stem and a head. A circuit board to be mounted on the standoff defines a clearance hole opening into a channel. The clearance hole is sufficiently large to clear the head of the standoff, and the channel is sufficiently wide to clear the stem but not the shoulder. A low-profile conductive clip has two resilient prongs. The clip is mounted to the circuit board so that the prongs are disposed along either side of at least a portion of the channel. The prongs are able to move toward and away from each other in a plane that is parallel to the plane of the circuit board. To mount the board, the head of the standoff is passed through the clearance hole, and the stem is moved to the end of the channel. When the stem reaches the end of the channel, the two prongs engage either side of the head, thereby creating the electrical connection.

BRIEF DESCRIPTION OF THE DRAWINGS

FIG. 1 is a side view of a circuit board mounted and electrically connected to a chassis, a frame or another circuit board or the like using a conductive standoff and a conductive clip according to a preferred embodiment of the invention.

FIG. 2 is a top view of a circuit board defining clearance holes and channels according to a preferred embodiment of the invention.

FIGS. 8–11 are oblique views illustrating steps for mounting and electrically connecting a circuit board to a chassis, frame, other circuit board or the like according to a preferred embodiment of the invention.

FIGS. 12 and 13 are top and oblique views, respectively, showing the head of a conductive standoff protruding through a circuit board and engaging a conductive clip according to a preferred embodiment of the invention.

FIGS. 14 and 15 are top views showing the head of a conductive standoff protruding through a circuit board and engaging a conductive clip according to alternative preferred embodiments of the invention.

DETAILED DESCRIPTION OF THE PREFERRED EMBODIMENTS

Figure 3:
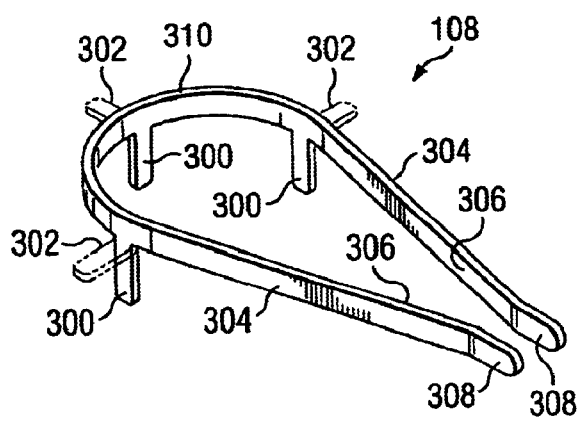
FIGS. 3, 4 and 5 are oblique, top and side views, respectively, of the clip shown in FIG. 1.

FIG. 1 illustrates low-profile mounting and connecting apparatus 100 according to a preferred embodiment of the invention. In the figure, a circuit board 102 is shown mounted and electrically connected to a chassis, frame or other circuit board 104 or the like using a conductive standoff 106 and a conductive clip 108. The various components shown in FIG. 1 will be discussed in more detail below with reference to FIGS. 2–14.

As shown in FIG. 2, circuit board 102 may be provided with one or more keyhole-type openings 200. Openings 200 maybe placed at any convenient locations on circuit board 102, and need not be placed in the corners as shown in the illustration. Each keyhole opening 200 includes a clearance hole 202 opening into a channel 204 having a closed end 206. Clearance hole 202 should be large enough in diameter to clear head 600 (see FIGS. 6–7) of standoff 106. Channel 204 should be wide enough to clear stem 602 of standoff 106 but not shoulder 604 of standoff 106. Standoff 106 may be mounted to chassis, frame or circuit board 104 by any conventional means, such as by a snap fit utilizing a circular notch 606 in standoff 106 (see FIG. 1).

Figure 4:
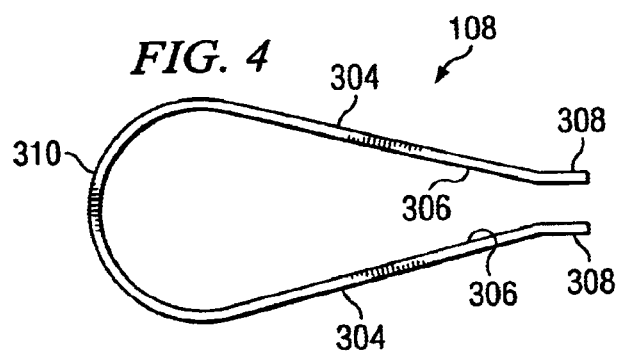
Figure 5:
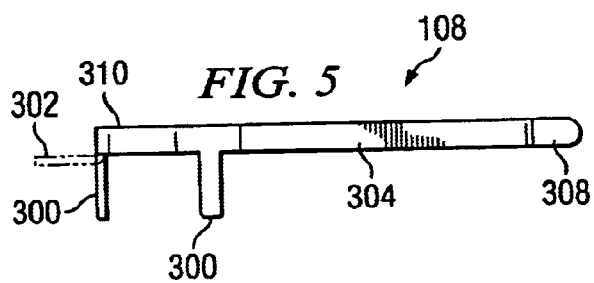
Figure 6:
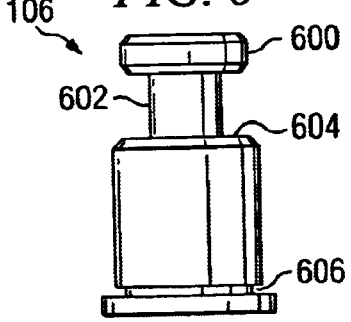
FIGS. 6 and 7 are side and oblique views, respectively, of the standoff shown in FIG. 1.
Figure 7:
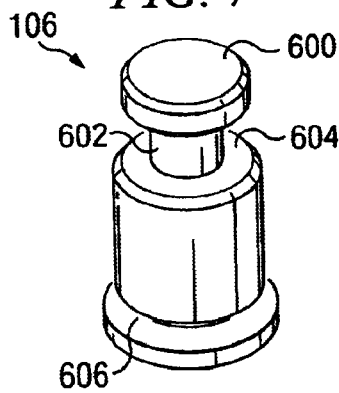
Figure 8:
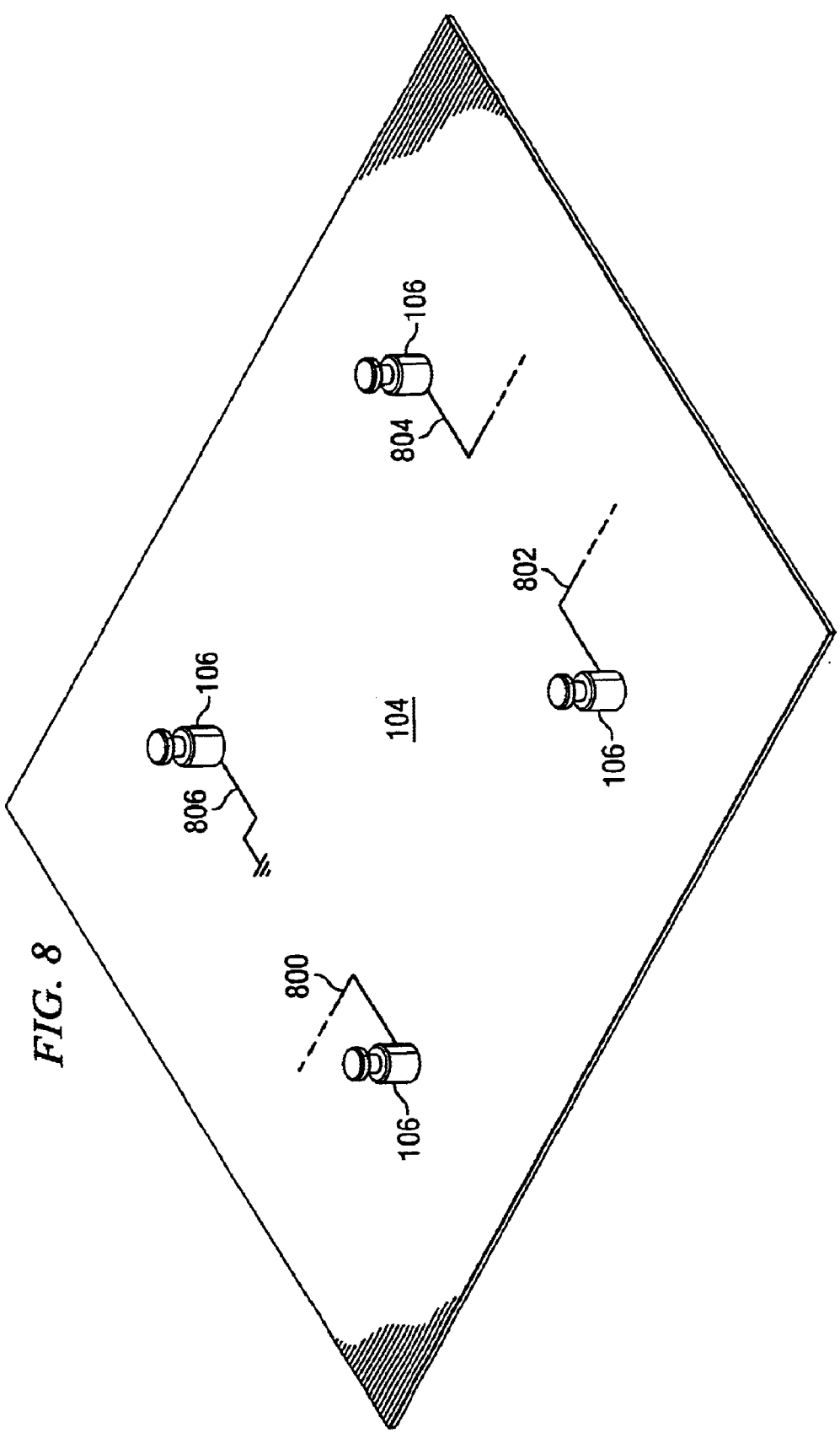

Conductive clip 108 is shown in more detail in FIGS. 3–5. Clip 108 includes two resilient prongs 304. Prongs 304 include engagement surfaces 306. Clip 108 should be mounted to circuit board 102 so that engagement surfaces 306 are disposed on either side of closed end 206 of channel 204. (See, for example, FIGS. 12–15.) In this manner, engagement surfaces 306 are capable of engaging head 600 of standoff 106 when stem 602 is disposed at closed end 206 of channel 204. Prongs 304 should be capable of movement toward and away from each other in a plane 110 that is parallel to the plane of circuit board 102, so as to accomplish receipt and engagement of head 600 as stem 602 is moved toward closed end 206 of channel 204. One way in which such movement may be accomplished is to construct clip 108 out of a continuous piece of metal (steel, for example) having a bend 310 substantially in its center such that engagement surfaces 306 oppose each other.

Numerous methods may be used to mount clip 108 to circuit board 102. For example, clip 108 may be provided with one or more legs 300. Legs 300 may be inserted into corresponding holes 208 in circuit board 102 and secured therein with a solder joint. Alternatively, legs 300 may be bent into positions 302 to facilitate surface-mounting clip 108 to circuit board 102, again by means of solder joints. The orientation of clip 108 on circuit board 102 may also be varied. For example, in FIG. 12, clip 108 is shown mounted to circuit board 102 at a mounting area 1200 that is closer to clearance hole 202 than to the closed end 206 of channel 204. But in FIG. 14, clip 108 is shown mounted to circuit board 102 at a mounting area 1400 that is closer to closed end 206 of channel 204 than to clearance hole 202. If the configuration of FIG. 12 is chosen, bend 310 may extend around clearance hole 202 as shown so as not to impede the insertion of head 600 through the hole.

In each of the preferred embodiments shown, clip 108 is mounted to circuit board 102 at its bend 310 in order to facilitate the above-described movement of prongs 304. However, different locations on clip 108 might also be chosen for securing it to circuit board 102. In addition, the shape of clip 108 may be varied. For example, the ends 308 of prongs 304 may be bent outwards to facilitate receipt of head 600. And engagement surfaces 306 may include opposing concave bends 1500 (see FIG. 15) so as to create a detent for receiving head 600.

Figure 9:
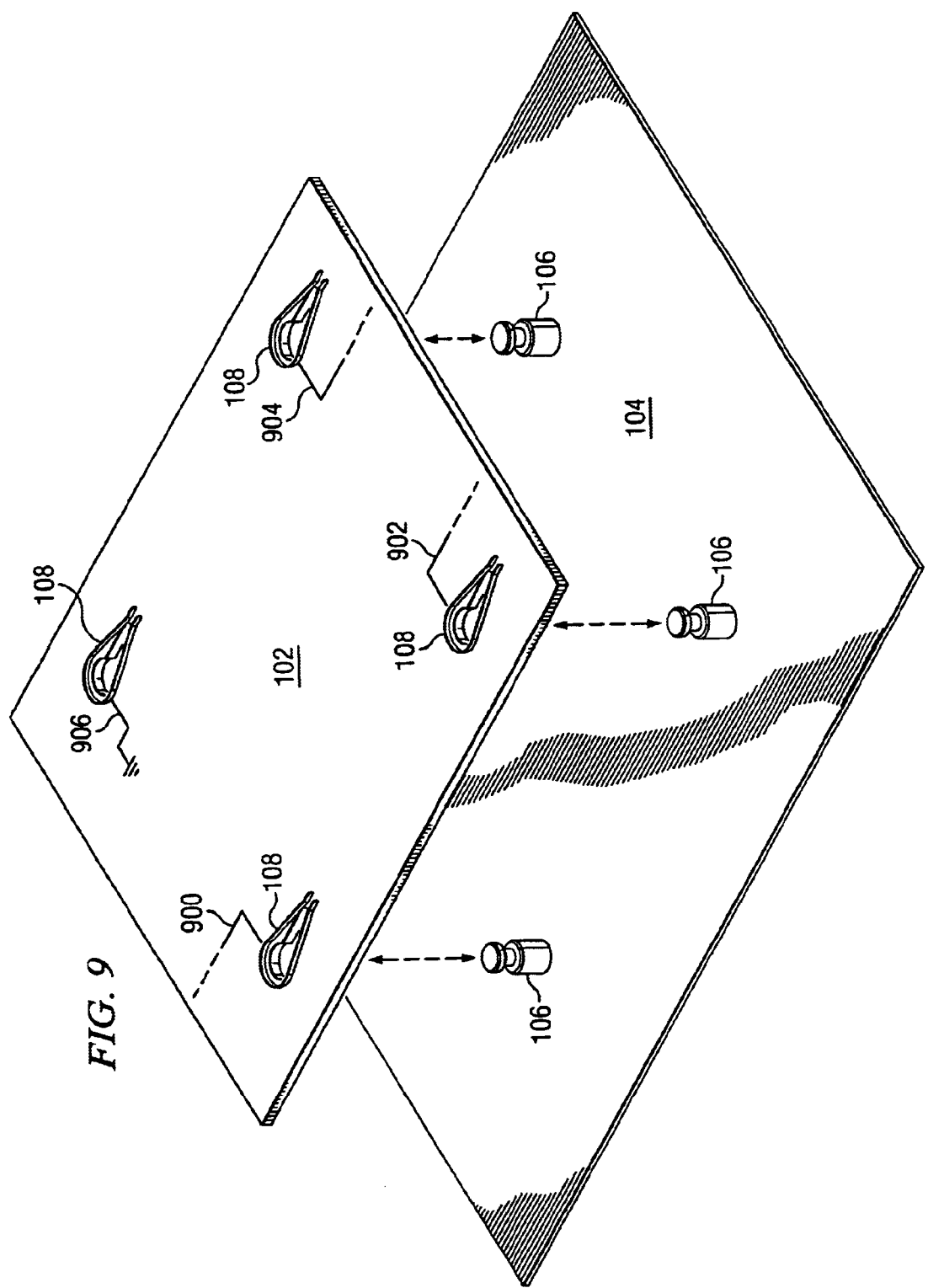
Figure 10:
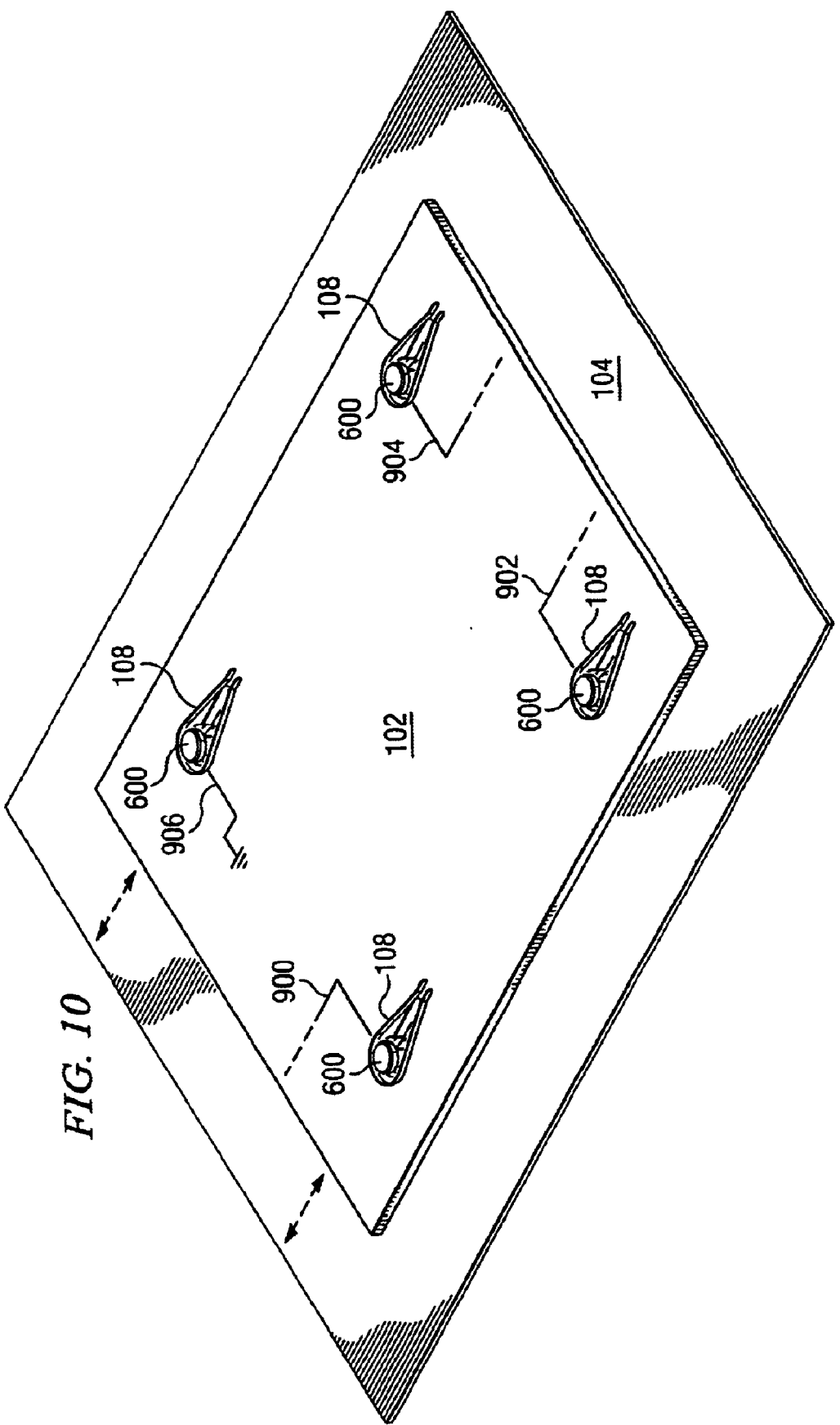

FIGS. 8–11 illustrate a preferred method of mounting and electrically connecting circuit board 102 to chassis, frame or other circuit board 104. Any number of standoffs 106 may be mounted to chassis, frame or circuit board 104 in any configuration. And any of standoffs 106 may be electrically connected to a circuit path as shown at 800–806. Corresponding keyholes and clips are provided on circuit board 102, as shown in FIG. 9. Any of the clips maybe electrically connected to a circuit path as shown at 900–906. Although circuit paths 800–806/900–906 may be for any purpose, most commonly such circuit paths may be used to provide a ground connection as indicated specifically at 806/906. To accomplish mounting and connection, circuit board 102 may be lowered over standoffs 106 so that heads 600 pass through clearance holes 202 as shown in FIG. 10. Circuit board 102 may then be translated relative to chassis, frame or circuit board 104 so that stems 602 move to the closed ends 206 of channels 204 as shown in FIG. 11. In the final position shown in FIG. 11, engagement surfaces 306 of prongs 304 engage either side of heads 600, thereby establishing electrical connections between circuit paths 800–806 and 900–906. To remove circuit board 102 from chassis, frame or circuit board 104, the process may simply be reversed.

What is claimed is:

1. Circuit board mounting and connecting apparatus, comprising:
    a conductive standoff having a head, a stem and a shoulder;
    wherein the circuit board defines a clearance hole opening into a channel, the clearance hole large enough to clear the head, the channel wide enough to clear the stem but not the shoulder; and
    a conductive clip having two resilient prongs;
    wherein the clip is mounted to the circuit board so that engagement surfaces of the prongs are:
        disposed on either side of a closed end of the channel;
        capable of movement toward and away from each other in a plane parallel to the plane of the circuit board; and
        capable of engaging either side of the head when the stem is disposed at the closed end of the channel.

2. Circuit board mounting and connecting apparatus according to claim 1, wherein:
    the clip is mounted to the circuit board at a mounting area closer to the clearance hole than to the closed end of the channel.

3. Circuit board mounting and connecting apparatus according to claim 1, wherein:
    the clip is mounted to the circuit board at a mounting area closer to the closed end of the channel than to the clearance hole.

4. Circuit board mounting and connecting apparatus according to claim 1, wherein:
    the clip comprises one continuous piece of metal having a bend substantially in its center such that the engagement surfaces of the prongs oppose one another.

5. Circuit board mounting and connecting apparatus according to claim 4, wherein:
    the clip is mounted to the circuit board at the bend.

6. Circuit board mounting and connecting apparatus according to claim 5, wherein:
    the bend extends around the clearance hole.

7. Circuit board mounting and connecting apparatus according to claim 1, wherein:
    the clip comprises at least one leg; and
    the clip is mounted to the circuit board by means of a solder joint between the at least one leg and the circuit board.

8. Circuit board mounting and connecting apparatus according to claim 1, wherein:
    the clip comprises one continuous piece of metal having a bend substantially in its center such that the engagement surfaces of the prongs oppose one another;
    at least one leg extends from the clip at the bend; and
    the clip is mounted to the circuit board by means of a solder joint between the at least one leg and the circuit board.

9. Circuit board mounting and connecting apparatus according to claim 1, wherein:
    the engagement surfaces of the prongs comprise opposing concave bends creating a detent for receiving the head.

10. Circuit board mounting and connecting apparatus according to claim 1, wherein:
    the clip is electrically connected to a circuit path on the circuit board.

11. Circuit board mounting and connecting apparatus according to claim 10, wherein:
    the circuit path is a ground path.

12. Circuit board mounting and connecting apparatus according to claim 1, wherein:
    the standoff is electrically connected to a circuit path in a chassis, a frame or another circuit board.

13. Circuit board mounting and connecting apparatus according to claim 12, wherein:
    the circuit path is a ground path.

14. Circuit board mounting and connecting apparatus according to claim 1, wherein:
    the ends of the prongs are bent away from one another to facilitate receipt of the head.

* * * * *